(12) United States Patent
Lee

(10) Patent No.: US 6,974,715 B2
(45) Date of Patent: Dec. 13, 2005

(54) METHOD FOR MANUFACTURING CMOS IMAGE SENSOR USING SPACER ETCHING BARRIER FILM

(75) Inventor: Ju-Il Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/669,996

(22) Filed: Sep. 24, 2003

(65) Prior Publication Data

US 2004/0129990 A1 Jul. 8, 2004

(30) Foreign Application Priority Data

Dec. 27, 2002 (KR) ............... 10-2002-0085085
Dec. 27, 2002 (KR) ............... 10-2002-0085113

(51) Int. Cl.$^7$ ............................................. H01L 21/00

(52) U.S. Cl. ................................................. 438/48

(58) Field of Search ................... 438/57, 69, 70, 438/71, 72, 73, 787, 791, 592, 585, 200, 438/45, 22, 433, 120, 56, 48; 257/496, 292, 257/291, 290, 233, 215, 506, 298, 222, 202, 257/162, 80

(56) References Cited

U.S. PATENT DOCUMENTS 6,166,405 A * 12/2000 Kuriyama et al. ........... 257/290
6,180,969 B1 * 1/2001 Yang et al. .................. 257/291
6,611,037 B1 * 8/2003 Rhodes ........................ 257/466

OTHER PUBLICATIONS

Van Zant, Peter: Microchip Fabrication (2000), McGraw-Hill, Fourth Edition, pp. 244-245.*
Furumiya et al., *High-Sensitivity and No-Crosstalk Pixel Technology for Embedded CMOS Image Sensor*, IEEE Transactions on Electron Devices, vol. 48, No. 10, Oct. 2001, pp. 2221-2227.
Nallapati et al., *Influence of Plasma Induced Damage During Active Etch on Silicon Defect Generation*, 2000 5$^{th}$ International Symposium on Plasma Process-Induced Damage, May 23-24, Santa Clara, CA, USA, 2000 American Vacuum Society, pp. 61-64.

* cited by examiner

Primary Examiner—Craig A. Thompson
Assistant Examiner—Monica D. Harrison
(74) Attorney, Agent, or Firm—Marshall, Gerstein & Borun LLP

(57) ABSTRACT

A method for fabricating a CMOS image sensor including a low voltage buried photodiode and a transfer transistor, includes the steps of: forming a field oxide for defining active area and field area on certain area of an epitaxial layer formed on a substrate, and forming a gate of transfer transistor on the epitaxial layer of the active area; forming the low voltage buried photodiode doping region in alignment with one side of the gate of transfer transistor and field oxide; forming a spacer insulation layer by stacking layers of oxide and nitride over the whole structure; forming a spacer block mask to open areas excluding doping region for the low voltage buried photodiode; and removing the spacer block mask, and forming a floating diffusion region on other side of the transfer transistor. Alternatively, the sacrificial nitride may be allowed to remain on the surface of the photodiode to improve optical properties for short wavelength lights.

6 Claims, 9 Drawing Sheets

Split A Results

Split B Results

METHOD FOR MANUFACTURING CMOS IMAGE SENSOR USING SPACER ETCHING BARRIER FILM

BACKGROUND

1. Technical Field

A method for fabricating a CMOS image sensor is disclosed and, more particularly a method for fabricating a CMOS image sensor is disclosed that reduces the amount of dark current by protecting the surface of a photodiode with spacer etching barrier film during the etching process for formulation of spacers.

2. Description of the Related Art

In general, an image sensor is a semiconductor device that converts an optical image into electrical signals. In a charge coupled device (CCD), a plurality of Metal-Oxide-Silicon (MOS) capacitors is placed in close proximity, and charge carriers are stored in or transferred between capacitors. CMOS image sensors are devices using as many MOS transistors as the number of pixels to detect output sequentially, and is based on CMOS technology that uses peripheral circuits such as control circuits and signal processing circuits.

As is well known, an image sensor for color images has a color filter array (CFA) on top of a photo sensing part, which generates and stores photo-generated charges in response to external lights. The color filter array (CFA) has 3 colors of Red, Green and Blue, or 3 colors of Yellow, Magenta and Cyan.

Also, the image sensor consists of a photo sensing part that detects light, and a logic circuit that converts the light into electrical signals and data. In order to increase photosensitivity, there are ongoing efforts to increase the "fill factor" (i.e., the ratio of area of the photo sensing part to the total area of an image sensor device). However, since the logic circuit part is indispensable, there is a limit to what these efforts can achieve. Therefore, for the purpose of increasing photosensitivity, a condenser lens technique was proposed, which controls the paths of the lights incident upon nearby areas outside the photo sensing part. An image sensor using this technique has a microlens formed on the CFA.

FIG. 1A is a circuit diagram showing a conventional CMOS image sensor whose unit pixel consists of 4 MOS transistors and 1 photodiode (PD). The CMOS image sensor is provided with a photodiode 100 for receiving light and for generating photo-generated charges, a transfer transistor 101 for transferring the photo-generated charges collected by the photodiode 100 to the floating diffusion region 102, a reset transistor 103 for setting the potential of the floating diffusion region to a desired value and for resetting the floating diffusion region 102 by outputting charges, a drive transistor 104 for operating as a source follower buffer amplifier, and a select transistor for 105 for providing addressing by switching. Outside the unit pixel, there's a load transistor 106 for reading output signals.

FIG. 1B through FIG. 1G are cross-sectional views showing the manufacturing process of forming these unit pixels, for transfer transistors and reset transistors. First, a lightly doped p-type epitaxial layer 11 is formed on a heavily doped p-type substrate 10 as shown on FIG. 1B. This combination is used because the lightly doped epitaxial layer 11 improves the performance characteristics by increasing the depth of the depletion layer, and the heavily doped substrate 10 prevents crosstalk between unit pixels.

Next, a field oxide layer 12 defining active area and field area is formed on desired areas of the epitaxial layer using thermal oxide. Next, the gates of the transfer transistor 13a and the reset transistor 13b are formed on the active area by depositing gate oxide (not shown), gate polysilicon 13a and 13b, and tungsten silicide 14 and by patterning them. Although not shown on FIG. 1B, the gates of a drive transistor Dx and a select transistor Sx are also patterned.

Next, as shown on FIG. 1C and FIG. 1D, after a first mask 15 is formed to open the area where photodiodes will be formed, a n-type ion implant region 16 for a photodiode is formed inside the epitaxial layer 11 between the transfer transistor 13a and the field oxide 12 by a high-energy ion implantation process. Subsequently, a low-energy ion implantation process is performed to form a p-type ion implant region 17 for photodiode between the n-type ion implant region 16 and the surface of the epitaxial layer. Through this process, a low voltage buried photo diode (LVBPD) is completed.

Next, as shown on FIG. 1E and FIG. 1F, spacer insulation layer 18 is deposited on the whole structure, in order to form a spacer 18 made of nitride or oxide film on the sidewalls of the gate electrode of the transistors. The spacer 18 is formed on both sidewalls of the gate electrode as shown on FIG. 1F, by performing blanket dry etching process.

At this time, the surface of the photodiode can get damaged during the blanket dry etching process, causing defects in the crystal lattice structure. These defects become the source of "dark current", or current that is caused by electrons moving from photo diode to floating diffusion region, even when there's no light present. This dark current is reported to be caused by various defects (line defect, point defect, etc.) or dangling bonds, existing near the edge of the active area. The dark current can be a serious problem in low illumination environment.

Next, as shown on FIG. 1G, a second mask 19 for forming floating diffusion region 20 and source/drain region 21 is formed, and n-type ion implantation process is performed. Next, usual subsequent processes are performed to finish the unit pixel manufacturing process.

According to the above described prior art, there is the problem that during the blanket etching for spacer formation, the surface of the photodiode becomes damaged, and dangling bonds existing on the damaged surface could cause dark current.

Also, the light incident upon the photodiode passes through the insulation film (mostly oxides) into the epitaxial layer. When the light passes from a low reflection coefficient material like the oxide to a high reflection coefficient material like the epitaxial layer, there is the problem that short wavelength lights like blue is reflected away, so photosensitivity becomes low.

SUMMARY OF THE DISCLOSURE

In order to solve the above described problems, a manufacturing method for CMOS image sensor is disclosed that reduces dark current by protecting the surface of the photodiode from the blanket dry etching using spacer etching barrier film, and therefore improves the optical properties for short wavelength light using a spacer forming insulation layer residual on the surface of the photodiode.

A method for fabricating a CMOS image sensor comprising low voltage buried photodiode and transfer transistor is disclosed. The disclosed method comprises: forming a field oxide for defining active area and field area on certain area of an epitaxial layer formed on a substrate, and forming a gate of transfer transistor on the epitaxial layer of the active area; forming the low voltage buried photodiode doping region in alignment with one side of the gate of transfer transistor and field oxide; forming a spacer insulation layer by stacking layers of oxide and nitride over the whole structure; forming a spacer block mask to open areas excluding doping region for the low voltage buried photodiode; and removing the spacer block mask, and forming a floating diffusion region on other side of the transfer transistor.

Another method for fabricating CMOS image sensor comprising a low voltage buried photodiode and transfer transistor is disclosed which comprises: forming a field oxide for defining active area and field area on certain area of an epitaxial layer formed on a substrate, and forming a gate of transistor on the epitaxial layer of the active area; forming an ion implantation oxide layer on top of epitaxial layer between gates of the transistor and the field oxide, and forming a doping region for the low voltage buried photodiode inside the epitaxial layer; forming a sacrificial nitride on the whole structure, and forming a spacer insulation layer on the sacrificial nitride layer; forming spacers on both sidewalls of transistor by blanket etching; and forming a floating diffusion region on other side of the transfer transistor.

BRIEF DESCRIPTION OF THE DRAWINGS

The above and other features of the disclosed methods will become apparent from the following description taken in conjunction with the accompanying drawings, wherein.

DETAILED DESCRIPTION OF THE PRESENTLY PREFERRED EMBODIMENTS

FIG. 2A through 2F are cross-sectional views of disclosed manufacturing process of a CMOS image sensor with emphasis on the transfer transistor and reset transistor.

Figure 1A:
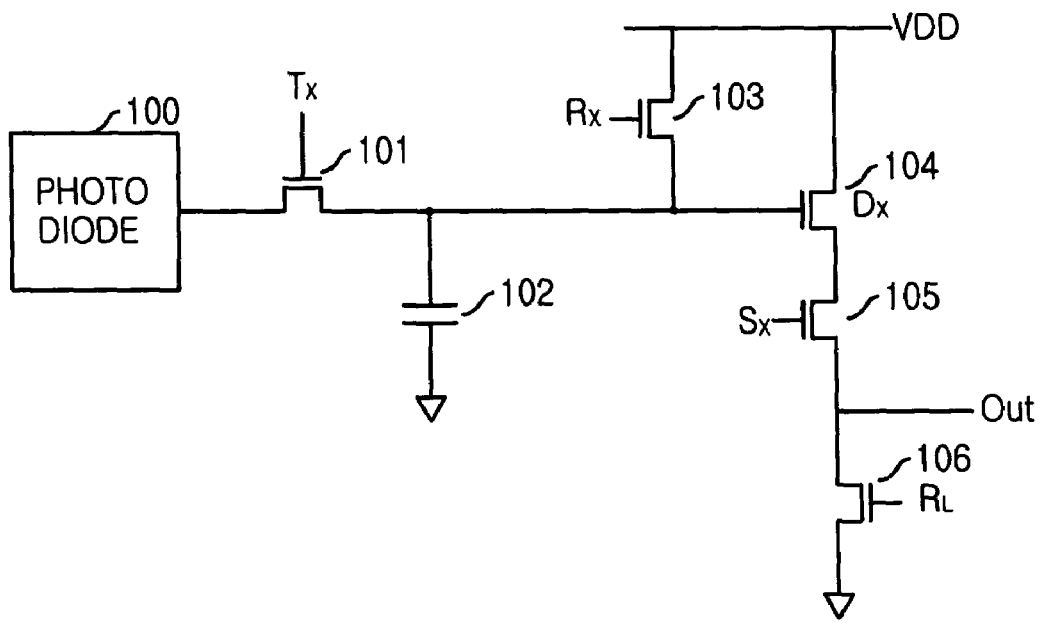
FIG. 1A is a circuit diagram of a single pixel in a conventional CMOS image sensor.
Figure 1B:
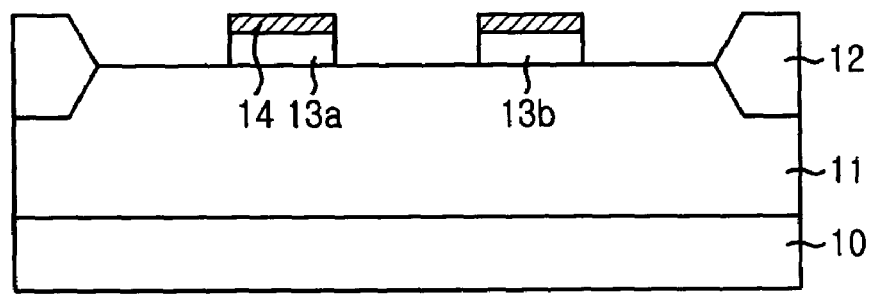
FIG. 1B through FIG. 1G are cross-sectional views showing a method for fabricating a CMOS image sensor according to the prior art.
Figure 1C:
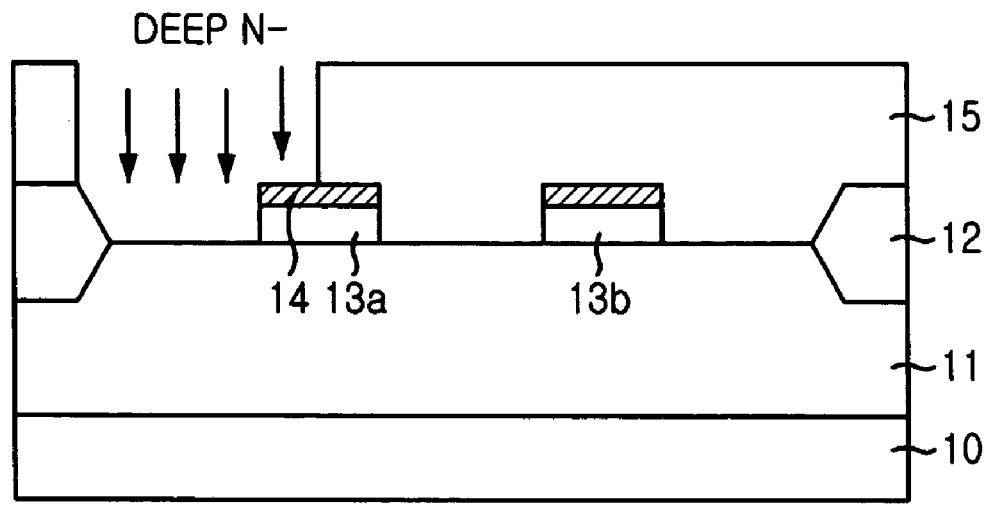
Figure 1D:
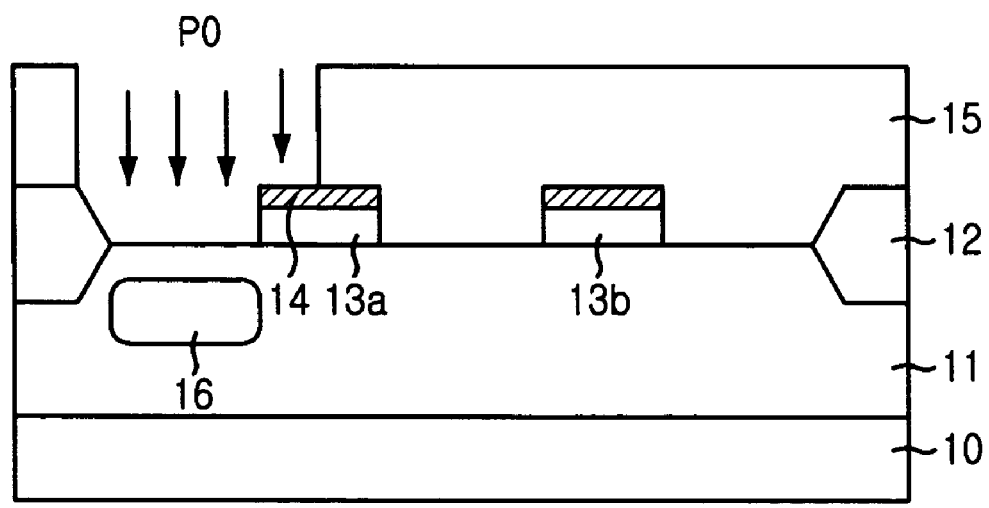
Figure 1E:
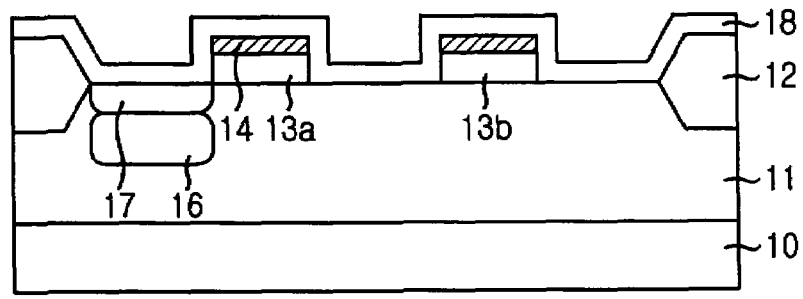
Figure 1F:
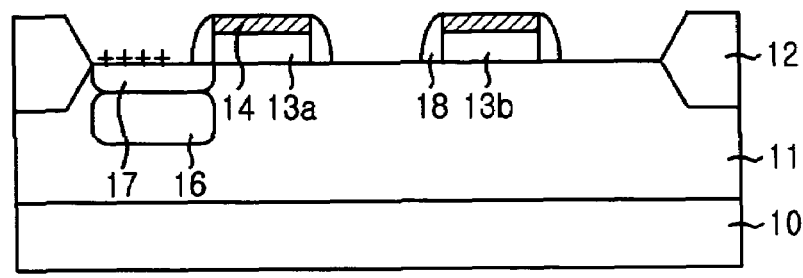
Figure 1G:
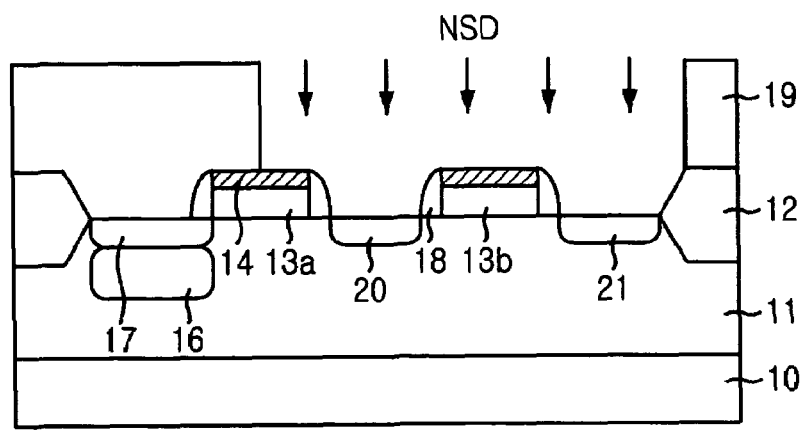
Figure 2A:
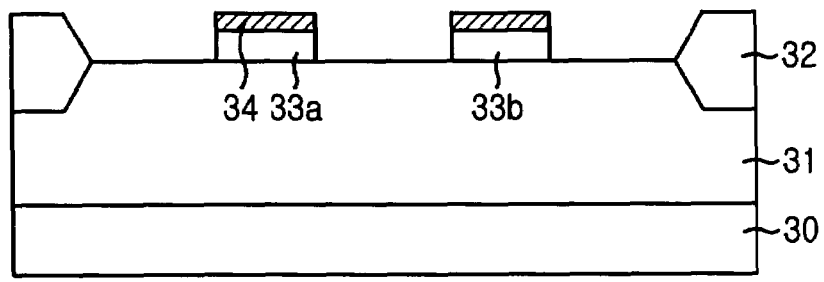
FIG. 2A through FIG. 2F are cross-sectional views showing a method for fabricating a CMOS image sensor according to a first disclosed embodiment.

First, a lightly doped p-type epitaxial layer 31 is formed on the heavily doped p-type substrate 30 as shown on FIG. 2A. This combination is used because the lightly doped epitaxial layer 31 improves the performance characteristics by increasing the depth of the depletion layer, and the heavily doped substrate 30 prevents crosstalk between unit pixels.

Next, a component isolator 32 is formed on some area of the epitaxial layer 31. In an embodiment, a field oxide using thermal oxide can be used as component isolator, however, it is possible to use trench structure as a component isolator.

Next, the gates of the transfer transistor 33a and the reset transistor 33b are formed on the active area by depositing gate oxide (not shown), gate polysilicon 33, and tungsten silicide 34 and by patterning them. Although not shown on FIG. 2A, gates of drive transistor Dx and select transistor Sx are patterned together.

Figure 2B:
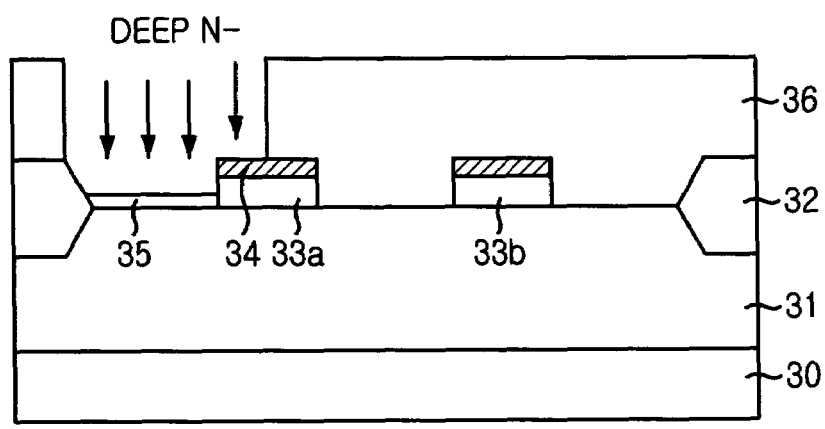
Figure 2C:
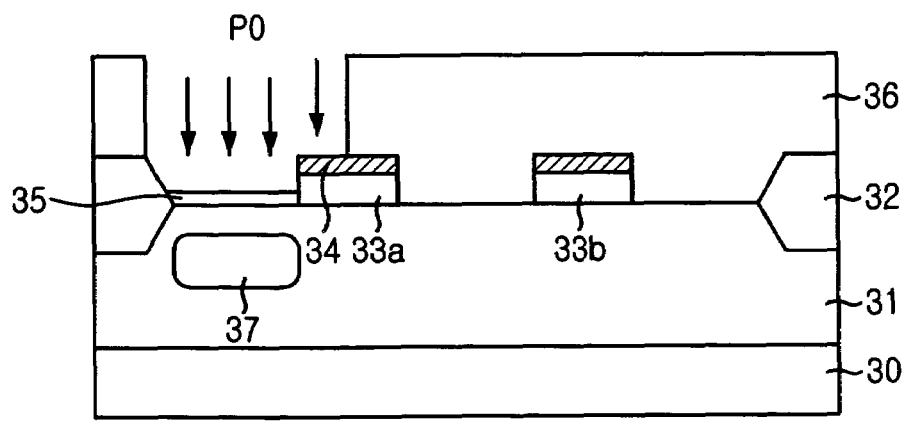

Next, referring to FIG. 2B and FIG. 2C, an ion implantation process is performed to form a low voltage buried photo diode (LVBPD). During the process, a screen oxide 35 for ion implantation is deposited on top of the epitaxial layer 31 where the doping region for a photodiode will be formed, to prevent damage on the surface of the semiconductor substrate. The screen oxide 35 has a thickness ranging from about 100 to about 500 Å.

Next, a first mask 36 is formed to open the area to form the photodiode, and a n-type ion implant region 37 is formed by a high energy ion implantation process, inside the epitaxial layer 31 between the transfer transistor 33a and the field oxide 32. Through this process, a low voltage buried photo diode (LVBPD) is completed.

Figure 2D:
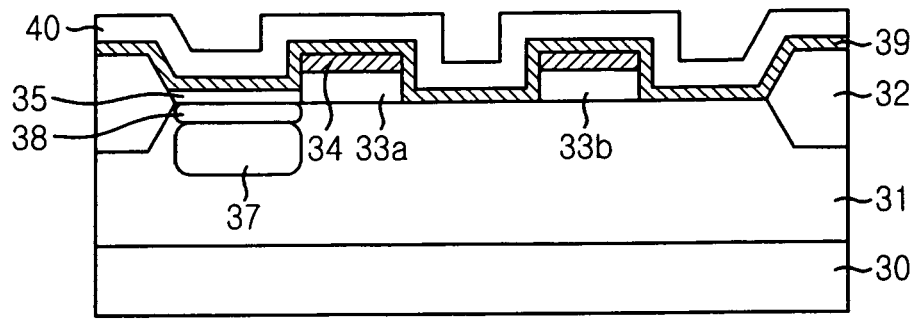

Next, as shown on FIG. 2D, a sacrificial nitride 39 is formed on the whole structure including the gate of the transfer transistor 33a, the gate of the reset transistor 33b, and screen oxide 35 for ion implantation. Then a spacer insulation layer 40 is formed on the sacrificial nitride 39. The sacrificial nitride 39 is made to have a thickness ranging from about 100 to about 500 Å.

The sacrificial nitride 39 is used to protect the surface of the photodiode during the process of forming a spacer 41 by blanket etching, and provides a good protection of the photodiode even when a considerable over-etching occurs during the blanket etching process, because the sacrificial nitride 39 has a high etching selectivity against the spacer insulation layer 40.

Figure 2E:
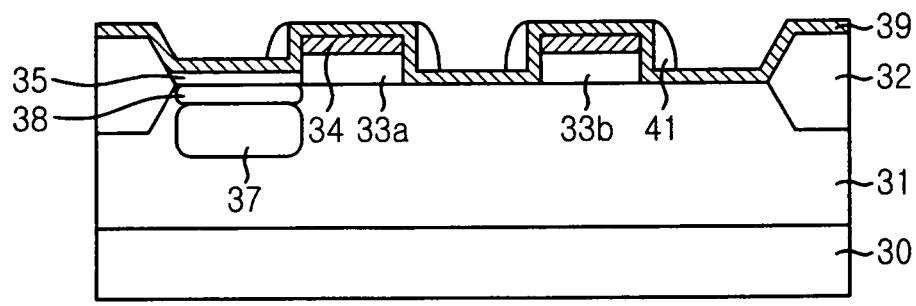

Next, as shown on FIG. 2E, an oxide spacer 41 is formed on both sidewalls of the transistor gate electrodes, by performing a blanket dry etching. Later, the residual sacrificial nitride 39 is removed by a wet etching technique. In an embodiment of the present invention, the damage to the surface of the photodiode is minimized, because a sacrificial nitride 39 is used to protect the surface of the photodiode during the blanket etching process, and a wet etching technique is used to remove the residual sacrificial nitride 39.

Figure 2F:
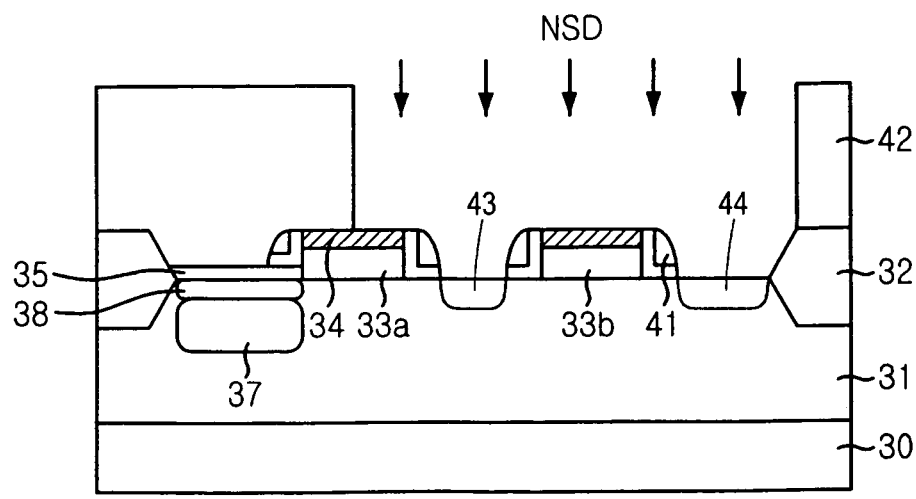

Next, as shown on FIG. 2F, in order to create a floating diffusion region and source/drain regions, a second mask 42 is formed and n-type ion implantation process is performed, to form a floating diffusion region 43 between the gate of transfer transistor 33a and the gate of reset transistor 33b, and a source/drain region 44 on other side of the reset transistor. Next, usual subsequent processes are performed to finish the unit pixel manufacturing process.

In another embodiment, the residual sacrificial nitride 39 is not removed and left on the surface, in order to improve the optical properties for lights of shorter wavelength, like blue light. In this embodiment, the sacrificial nitride 39 in FIG. 2E is not removed by the wet etching technique, but is allowed to remain on the surface of the photodiode to improve optical properties. In the following, a technique for improving optical properties for lights of shorter wavelength, like blue, using residual sacrificial nitride 39 on the surface of the photodiode is explained.

FIG. 3A through FIG. 3F are cross-sections of manufacturing process of a CMOS image sensor according to the second embodiment, illustrated with emphasis on the transfer transistor and reset transistor.

Figure 3A:
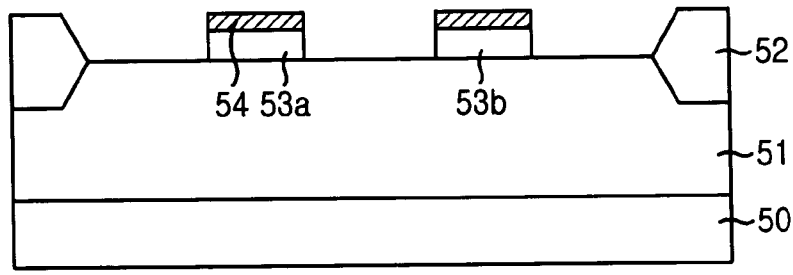
FIG. 3A through FIG. 3F are cross-sectional views of showing manufacturing method of a CMOS image sensor according to a second disclosed embodiment.

First, referring to FIG. 3A, a lightly doped p-type epitaxial layer 51 is formed on a heavily doped p-type substrate 50. This combination is used because the lightly doped epitaxial layer 51 improves the performance characteristics by increasing the depth of the depletion layer, and the heavily doped substrate 50 prevents crosstalk between unit pixels.

Next, component isolator is formed on desired areas of the epitaxial layer 51. A field oxide 52 using thermal oxide film is used as the component isolator. Although the field oxide was used as the component isolator in this embodiment of the present invention, it is possible to use a component isolator using a trench structure.

Next, gate oxide (not shown), gate polysilicon 53a and 53b, and tungsten silicide 54 are sequentially deposited on the active area, and then patterned to form the gates of the transfer transistor 53a and the reset transistor 53b. Although not shown on FIG. 3A, the gates of a drive transistor Dx and a select transistor Sx are also patterned at this time.

Figure 3B:
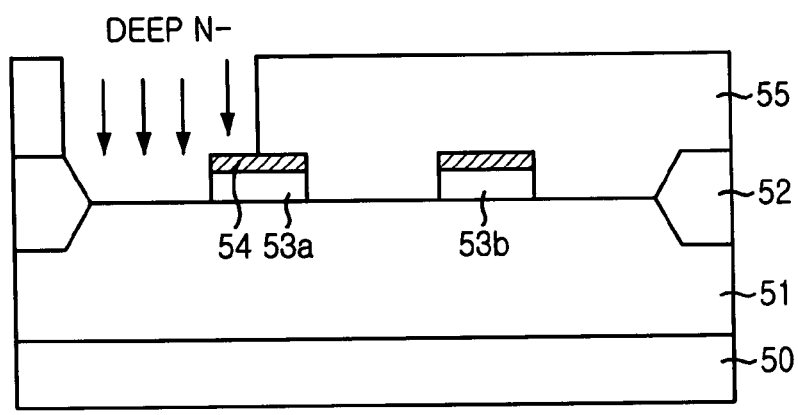
Figure 3C:
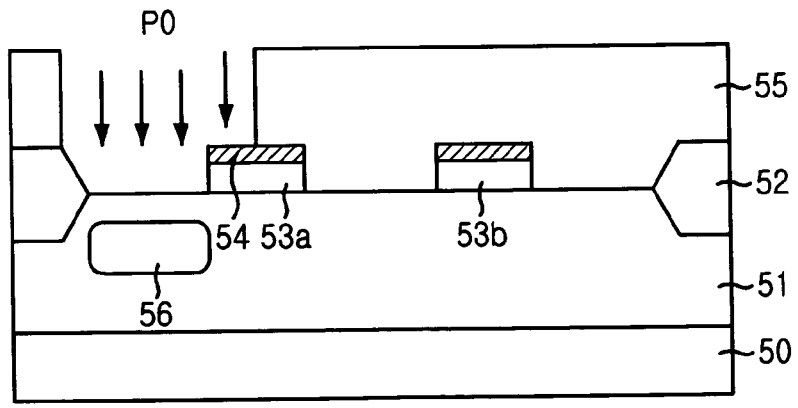

Next, referring to FIG. 3B and FIG. 3C, after a first mask 55 is formed to open the area where photodiodes will be formed, a n-type ion implant region 56 for photodiode is formed inside the epitaxial layer 51 between the transfer transistor 53a and the field oxide 52 by a high-energy ion implantation process. Subsequently, a low-energy ion implantation process is performed to form a p-type ion implant region 57 for the photodiode between the n-type ion implant region 56 and the surface of the epitaxial layer, by a high-energy ion implantation process. Through this process, a low voltage buried photo diode (LVBPD) is completed.

Figure 3D:
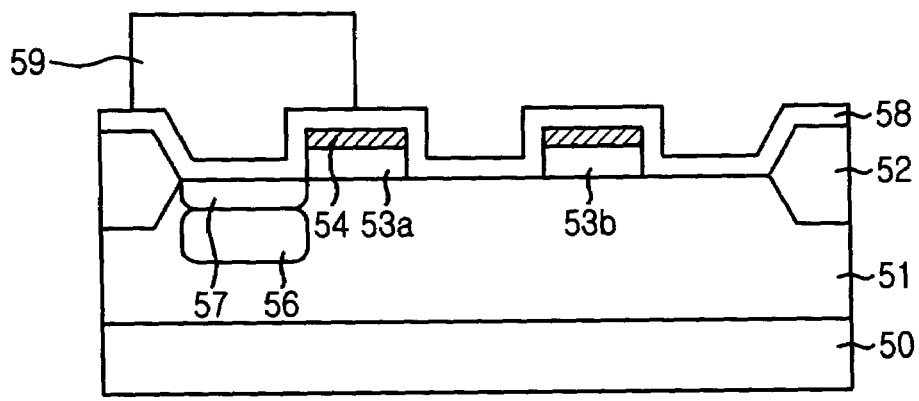
Figure 3E:
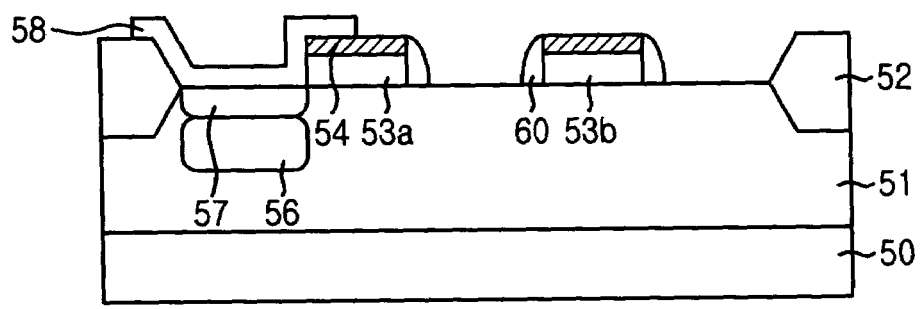
Figure 3F:
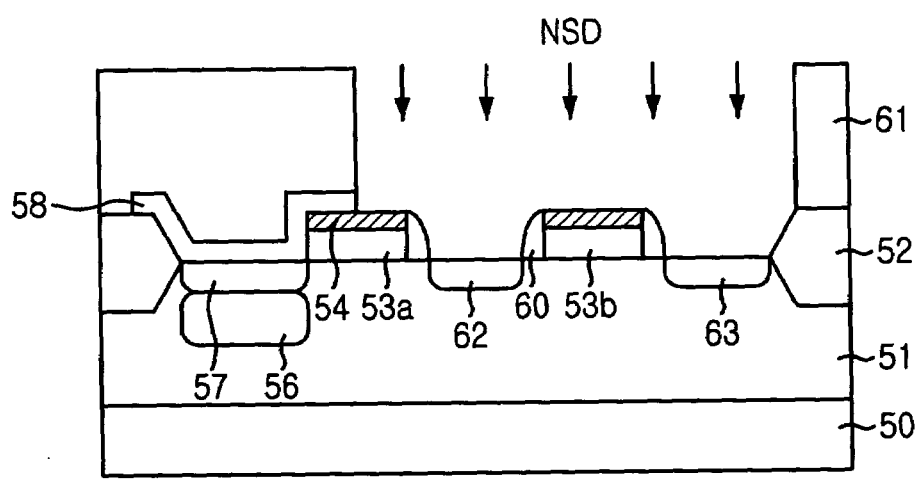

Next, referring to FIG. 3D and FIG. 3E, a spacer insulation layer 58 is deposited on the entire structure, in order to form spacers on both sidewalls of the gates of the transistors. In an embodiment, an insulation film of stacked layers of oxide and nitride is used as a spacer insulation layer 58. More specifically, an oxide layer is deposited on the epitaxial layer 51 with a thickness ranging from about 200 Å to about 1000 Å. On top of this layer, a nitride layer is deposited forming stacked layers, with a thickness ranging from about 200 Å to about 1000 Å. This is to improve the optical properties for lights of shorter wavelength, like blue. This will be further described later.

Next, a spacer block mask 59 is patterned, so that the spacer insulation layer 58 formed on the surface of the epitaxial layer in photodiode area is not removed during the subsequent etching process. The spacer block mask 59, as shown on FIG. 3D, is patterned in such a way as to mask the photodiode area between the field oxide 52 and transfer transistor gate 53a but expose other areas. The spacer block mask 59 is easily formed by using the first mask 55 for the low voltage buried photo diode, and a negative photoresist.

After the spacer block mask 59 is formed this way, a blanket dry etching is performed to form spacers 60 on both sidewalls of the gate, as shown on FIG. 3E. After this, the spacer block mask 59 is removed. During the blanket dry etching process, because of the existence of spacer block mask 59, the spacer insulation layer 58 will remain intact on the photodiode.

Next, a second mask 61 is formed to form a floating diffusion region 62 and source/drain region 63. After this, n-type ion implantation process is performed to form the floating diffusion region 62 and source/drain region 63.

Next, the second mask 61 is removed, and usual subsequent processes are performed to manufacture the CMOS image sensor.

In the CMOS image sensor made according to the disclosed methods, the spacer insulation layer remains on the surface of the photodiode, which prevents damage to the surface of the photodiode during the blanket dry etching process, and as a result, provides the advantage of reducing dark current.

Figure 4A:
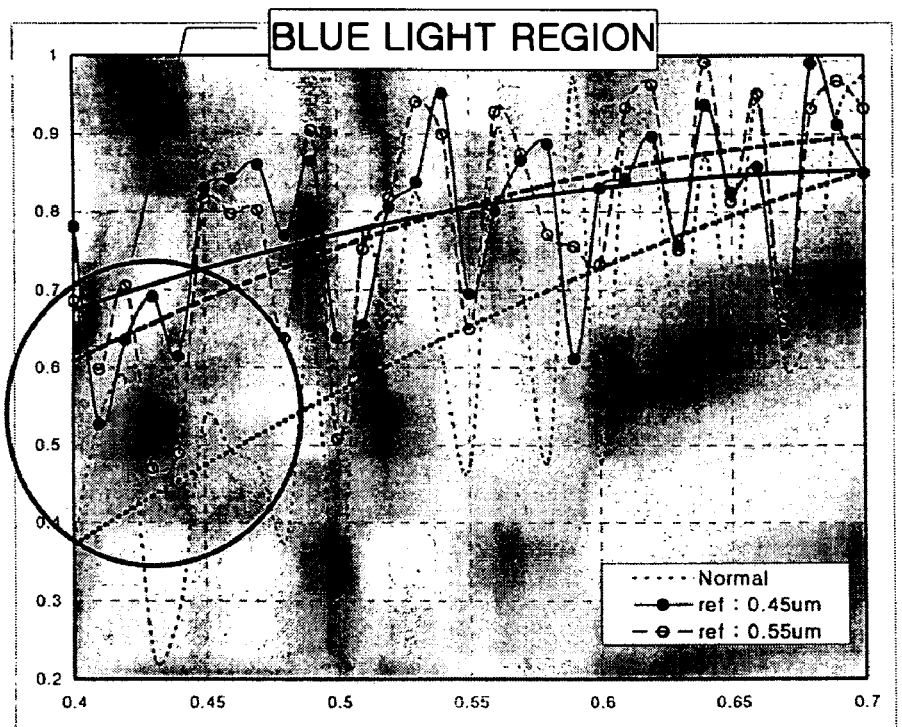
FIG. 4A through FIG. 4C are graphs showing optical properties of a short wavelength light incident upon a photodiode of a CMOS image sensor made according to the disclosed methods.
Figure 4B:
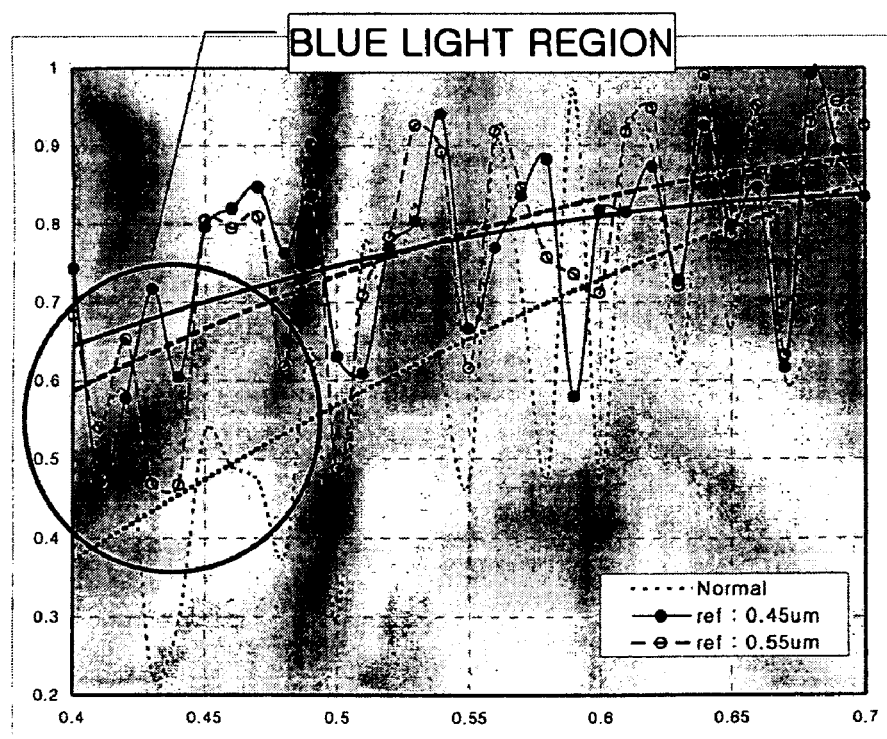
Figure 4C:
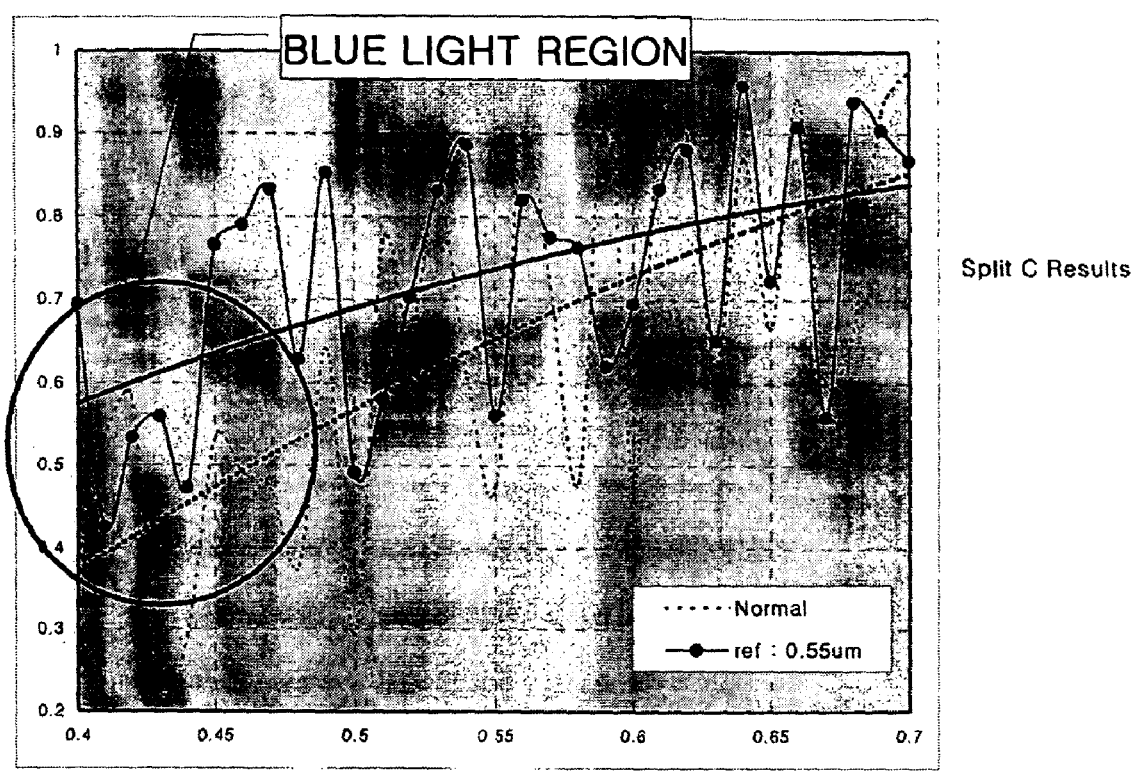

FIG. 4A through FIG. 4C graphically show the results of experiments for light transmittance of lights incident upon the photodiode, when stacked layers of nitride and oxide are used as the spacer insulation layer, and the spacer insulation layer is allowed to remain on the surface of the photodiode.

FIG. 4A is a graph showing the light transmittance of lights incident upon the photodiode, using lights of wavelengths 0.45 $\mu$m or 0.55 $\mu$m, for two cases. The first case is according to a disclosed embodiment, and an oxide layer with a thickness of about 200 Å and a nitride layer with a thickness ranging from about 360 Å to about 480 Å are stacked on the surface of the photodiode. The second case (denoted 'normal' in FIG. 4A) is according to the prior art.

In FIG. 4A, the average light transmittance of normal case (according to the prior art), and the average light transmittance of lights with wavelengths of 0.45 $\mu$m or 0.55 $\mu$m are shown together.

It can be seen that the light transmittance has increased for the stacked layers of nitride and oxide, compared to the case of the prior art, for lights of shorter wavelength. In the graph of FIG. 3A, the x axis represents the wavelength of lights (unit: Å), and y axis represents light transmittance.

FIG. 4B is a graph showing light transmittance of lights incident upon the photodiode for two cases. The first case is according to a disclosed embodiment, where an oxide layer with a thickness of about 300 Å and a nitride layer with a thickness ranging from about 260 Å to about 380 Å are stacked on the surface of the photodiode. The second case (denoted 'normal' in FIG. 4A) is according to the prior art.

FIG. 4C is a graph showing light transmittance of light incident upon the photodiode for two cases. The first case is according to another embodiment, where an oxide layer with a thickness of about 500 Å and a nitride layer with a thickness of about 180 Å are stacked on the surface of the photodiode. The second case (denoted 'normal' in FIG. 4A) is according to the prior art.

Referring to FIG. 4B and FIG. 4C, light of wavelengths 0.45 $\mu$m or 0.55 $\mu$m were used, as in FIG. 4A.

In FIG. 4B and FIG. 4C, the average light transmittance of normal case (according to the prior art), and the average light transmittance of light with wavelengths of 0.45 $\mu$m or 0.55 $\mu$m are shown together. The averages are shown as almost straight lines in both FIG. 4b and FIG. 4C.

In FIG. 4B and FIG. 4C, it can be seen that the light transmittance has increased in case of the stacked layers of nitride and oxide, compared to the case of the prior art, for lights of shorter wavelength like blue.

It is evident from FIG. 4A through FIG. 4C that the light transmittance increases for lights of short wavelength, including blue, when a spacer of stacked layers of nitride and oxide is used, and when the spacer is allowed to remain on the surface of the photodiode.

The disclosed methods described above is not limited by the above described embodiments or to the attached drawings. It should be obvious to those skilled in the art that various substitution, modifications, and alterations may be made to the disclosed methods without departing from the spirit and scope of this disclosure as defined in the appended claims.

What is claimed is:

1. A method for fabricating a complimentary metal-oxide-silicon (CMOS) image sensor including a low voltage buried photodiode and a transfer transistor, the method comprising:
   a) forming a field oxide for defining an active area and a field area on a certain area of an epitaxial layer formed on a substrate, and forming a gate of a transfer transistor on the epitaxial layer of the active area;

b) forming a low voltage buried photodiode doping region in alignment with one side of the gate of the transfer transistor;

c) forming a spacer insulation layer by stacking layers of oxide and nitride on the entire resulting structure of part (b);

d) forming a spacer block mask on the spacer insulation layer to open area opposite the transfer transistor from the low voltage buried photodiode doping region while leaving the photodiode doping region covered by the spacer insulation layer and spacer block mask; and e) removing the spacer insulation layer not covered by the spacer block mask to form a spacer on a sidewall of the transistor, and removing the spacer block mask.

2. The method for fabricating CMOS image sensor as recited in claim 1, wherein the oxide layer of the spacer insulation layer has a thickness ranging from about 200 Å to about 2000 Å, and the nitride layer of the spacer insulation layer has a thickness ranging from about 200 Å to about 1000 Å.

3. The method for fabricating CMOS image sensor as recited in claim 1, wherein part b) further comprises: sequentially performing n-type ion implantation and p-type ion implantation using a first mask with an opening disposed over the low voltage buried photodiode doping region.

4. The method for fabricating CMOS image sensor as recited in claim 3, wherein the spacer block mask of part d) is formed using the first mask of part b) and a negative photoresist.

5. A CMOS image sensor made in accordance with the method of claim 1.

6. The method for fabricating CMOS image sensor as recited in claim 1, further comprising:

forming a second mask over the portion of the space insulation layer remaining on the photodiode doping region and leaving the area opposite the transfer transistor open; and forming a floating diffusion region on the open area opposite the transfer transistor from the photodiode doping region while the second mask and the remaining portion of the space insulation layer is in place over the photodiode doping region.

* * * * *